United States Patent [19]
Tokunaga

[11] Patent Number: 5,134,018
[45] Date of Patent: Jul. 28, 1992

[54] HYBRID SUBSTRATE

[75] Inventor: Hiroyuki Tokunaga, Kawasaki, Japan

[73] Assignee: Canon Kabushiki Kaisha, Tokyo, Japan

[21] Appl. No.: 742,189

[22] Filed: Aug. 2, 1991

Related U.S. Application Data

[63] Continuation of Ser. No. 641,797, Jan. 16, 1991, abandoned, which is a continuation of Ser. No. 234,167, Aug. 19, 1988, abandoned.

[30] Foreign Application Priority Data

Aug. 20, 1987 [JP] Japan ................................ 62-206807
Aug. 20, 1987 [JP] Japan ................................ 62-206808

[51] Int. Cl.$^5$ .............................................. B32B 7/00
[52] U.S. Cl. ..................................... 428/209; 428/210; 428/446; 428/448; 428/698; 428/699; 428/704; 428/901; 357/81; 338/195
[58] Field of Search ................... 338/195, 308; 257/81; 148/105; 428/209, 210, 446, 448, 698, 699, 704, 901

[56] References Cited

U.S. PATENT DOCUMENTS

| | | | |
|---|---|---|---|
| 3,662,399 | 5/1972 | Yanoura et al. | 346/140 |
| 4,035,607 | 7/1977 | Wu | 437/68 |
| 4,213,030 | 7/1980 | Kawamura et al. | 219/216 |
| 4,217,570 | 8/1980 | Holmes | 338/195 |
| 4,252,861 | 2/1981 | Heaps et al. | 428/446 |
| 4,288,776 | 9/1981 | Holmes | 338/308 |
| 4,375,993 | 3/1983 | Mori et al. | 148/1.5 |

FOREIGN PATENT DOCUMENTS

| | | |
|---|---|---|
| 4160485 | 10/1985 | Australia . |
| 0240306 | 7/1987 | European Pat. Off. . |
| 3504199 | 7/1986 | Fed. Rep. of Germany . |
| 5356042 | 1/1976 | Japan . |
| 5929460 | 8/1982 | Japan . |

Primary Examiner—Patrick J. Ryan
Assistant Examiner—Kam Lee
Attorney, Agent, or Firm—Fitzpatrick, Cella, Harper & Scinto

[57] ABSTRACT

A hybrid substrate comprises an aluminum-based ceramic base substrate and a silicon layer provided on the base substrate.

5 Claims, 8 Drawing Sheets

$SiH_2Cl_2 : HCl : H_2 = 1.2 : 1.0 : 100 \, (l/min)$

Pressure : 150 torr

HYBRID SUBSTRATE

This application is a continuation of application Ser. No. 07/641,797 filed Jan. 16, 1991, now abandoned, which is a continuation of application Ser. No. 07/234,167 filed Aug. 19, 1988, now abandoned.

BACKGROUND OF THE INVENTION

1. Field of the Invention

This invention relates to a hybrid substrate for use in an active device having a fine pattern.

2. Related Background Art

In the prior art, for substrates for forming large area active device having fine patterns such as a heat-sensitive head or an ink jet head, an alumina substrate or a silicon substrate has been employed.

However, on the alumina substrate, due to poor flatness of the surface, it was impossible to form a device having fine line width of about 10 μm. Also, for improvement of the surface flatness, a substrate having molten glass coated on the surface of alumina was proposed. However, the thermal conductivity of glass is as considerably poor as about 1/20 of that of alumina. Moreover, when a heat-generating device was formed on glass, due to the heat accumulating effect, it was difficult to control on-off switch of heat generation of the device by high frequency.

On the other hand, although silicon wafer has a good surface flatness as a substrate, it is high in cost. Further, polysilicon wafer, which is slightly less expensive than silicon wafer, has the drawback that it has remarkably low mechanical strength.

On the other hand, substrates with a constitution having a polycrystalline film deposited on a base substrate has been proposed in the prior art. For example, there has been a substrate deposited a polycrystalline silicon film on a quartz base substrate, and thin film transistors formed on the substrate have been practically applied. However, in this example, the grain size of the polycrystal is substantially uniform over the film thickness direction.

Accordingly, when a polycrystalline silicon film was deposited to a film thickness of 30 μm or more, the following problems arose.

That is, in case where the grain size was so fine as 1000 Å or less, thermal conductivity was worsened due to the presence of a large number of grain boundaries, which caused a problem in forming a heat-generating device on the substrate surface.

On the other hand, for example, when the grain size was as large as 3 μm or more, a problem that the flatness of the substrate surface was remarkably poor existed. Also, because of the difference in coefficient of thermal expansion between the base substrate and the polycrystalline silicon film to be deposited, crack or peel-off was caused to occur in the polycrystalline silicon film in the cooling step after the formation of deposition film with heating.

SUMMARY OF THE INVENTION

An object of the present invention is to provide a hybrid substrate solving the problems of the prior art as mentioned above. Another object of the present invention is to provide a hybrid substrate of low cost having good flatness of surface.

Still another object of the present invention is to solve all of the problems which occur in a substrate with a constitution of a polycrystalline film deposited to 30 μm or more on a base substrate and to provide a hybrid substrate having flat surface and good thermal conductivity.

Still another object of the present invention is to provide a hybrid substrate comprising a polycrystalline layer of a different material from a ceramic base substrate deposited on the ceramic base substrate, the polycrystalline layer being constituted of two or more layers having different crystal grain sizes.

Still another object of the present invention is to provide a hybrid substrate comprising a silicon layer provided on an aluminum-based ceramic base substrate.

Still another object of the present invention is to provide a hybrid substrate comprising a silicon layer provided on a polycrystalline ceramic base substrate.

BRIEF DESCRIPTION OF THE DRAWINGS

FIGS. 2A and 2B(a) to 2B(c) are diagrams of the steps for preparation of the hybrid substrate of the present invention according to the microwave CVD method;

DESCRIPTION OF THE PREFERRED EMBODIMENTS

The present invention is described in detail by referring to Embodiments as follows.

Embodiment 1

Figure 1A:
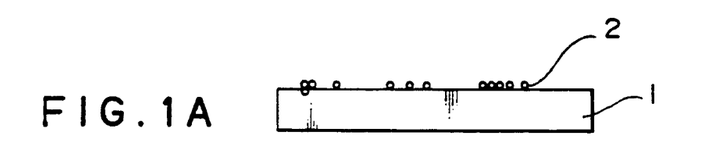
FIGS. 1A to 1C are diagrams of the steps for preparation of the hybrid substrate of the present invention according to the hot CVD method.
Figure 1B:
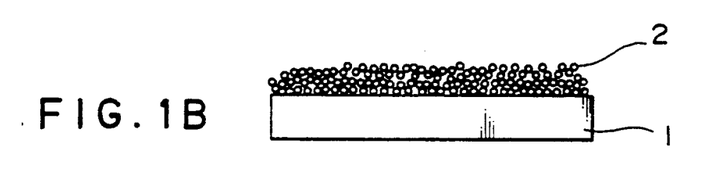
Figure 1C:
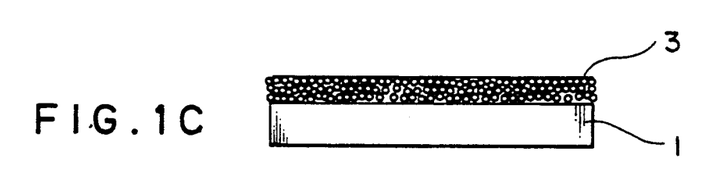

FIGS. 1A to 1C illustrate a first embodiment of the present invention, showing the diagrams of the steps when a hybrid substrate having a flattened surface to be provided with an electronic device thereon is formed by depositing a polysilicon film on a polycrystalline alumina base substrate according to the CVD method. In the following, the respective steps are to be described.

Step (a) On an alumina substrate 1 not subjected to surface polishing, a polysilicon layer 2 constituted by polycrystalline silicon grains with grain sizes which can fill the unevenness on the surface of the alumina base substrate 1 is deposited while controlling the nucleation density.

The deposition of the polysilicon layer 2 is carried out by first surface cleaning by passing HCl gas over the surface of the alumina base substrate 1 heated to a high temperature, and then effected by use of reactive gases such as $SiCl_4$, $SiH_2Cl_2$, etc. diluted with $H_2$ under reduced pressure (ca. 10-150 Torr) at a substrate temperature of 900° to 1100° C. The deposition speed at this time is preferably 40 to 60 μm/hr (FIG. 1A).

Step (b) Under the above condition, polysilicon layer of about 50 μm is deposited in about 40 minutes, and the unevenness on the surface of the alumina base substrate 1 is completely covered therewith (FIG. 1B).

Step (c) Next, in order to improve flatness of the alumina base substrate 1, mechanical polishing is applied to shave the polysilicon layer to about 30 μm (FIG. 1C).

In the above method, an alumina with coarse surface unevenness can be used as the base substrate, and throughout can be increased on account of great deposition speed of polysilicon layer.

Embodiment 2

As a second embodiment of the present invention, the method of forming a hybrid substrate by depositing an amorphous silicon film or a polysilicon film by microwave plasma CVD method on a polycrystalline aluminum nitride base substrate is to be described.

Figure 2A:
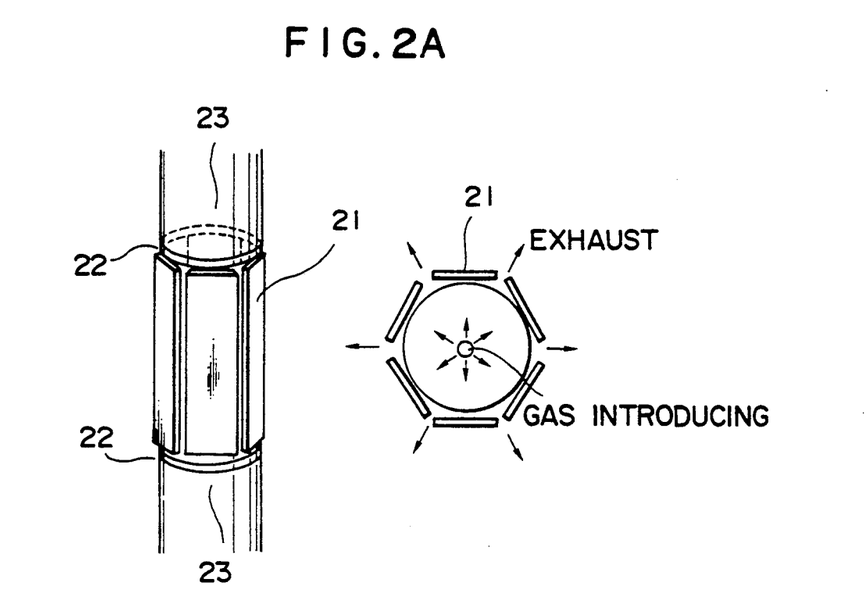
Figure 2B:
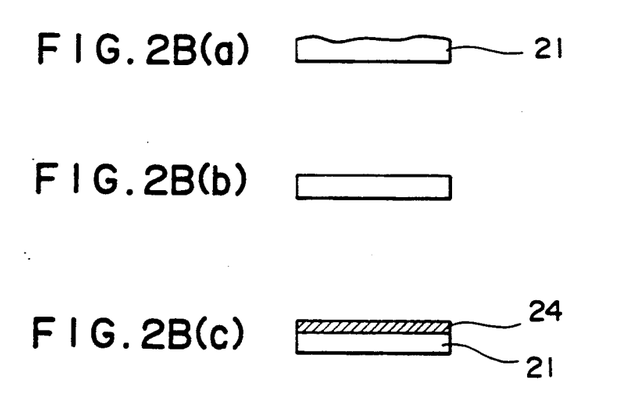

FIG. 2A is a schematic constitutional illustration showing an example of a microwave plasma CVD device. The aluminum nitride base substrate 21 is arranged with the deposition surface being directed toward the inner side on the circumference, and $SiH_4$ gas is introduced from the center portion to effect plasma CVD by introducing μ wave (2.45 $GH_z$) 23 in the vertical direction.

FIGS. 2B(a) to 2B(c) illustrate the preparation steps of the hybrid substrate.

Step (a) The aluminum nitride base substrate 21 with coarse surface is prepared (FIG. 2B(a)).

Step (b) Rough lapping shaves off extreme unevenness (FIG. 2B(b)).

Step (c) Next, amorphous silicon film or polysilicon film 24 is deposited to about 30 μm by microwave plasma CVD method (FIG. 2B(c)).

The deposition conditions, for example, for 6 sheets of the aluminum nitride base substrates of 250 mm × 60 mm may be 170 to 340 sccm of $SiH_4$, 200° to 480° C. of substrate temperature, 0.5 to 20 mTorr of pressure and 500 W to 2 kW of microwave power. The deposition time can be 20 to 40 minutes to deposit a film to about 30 μm. When the substrate temperature becomes 380° C. or higher, the film will become a polysilicon.

The hybrid substrate prepared according to the above steps is not required to be polished due to the good surface characteristic of the amorphous silicon film or polysilicon film.

Embodiment 3

Figure 3:
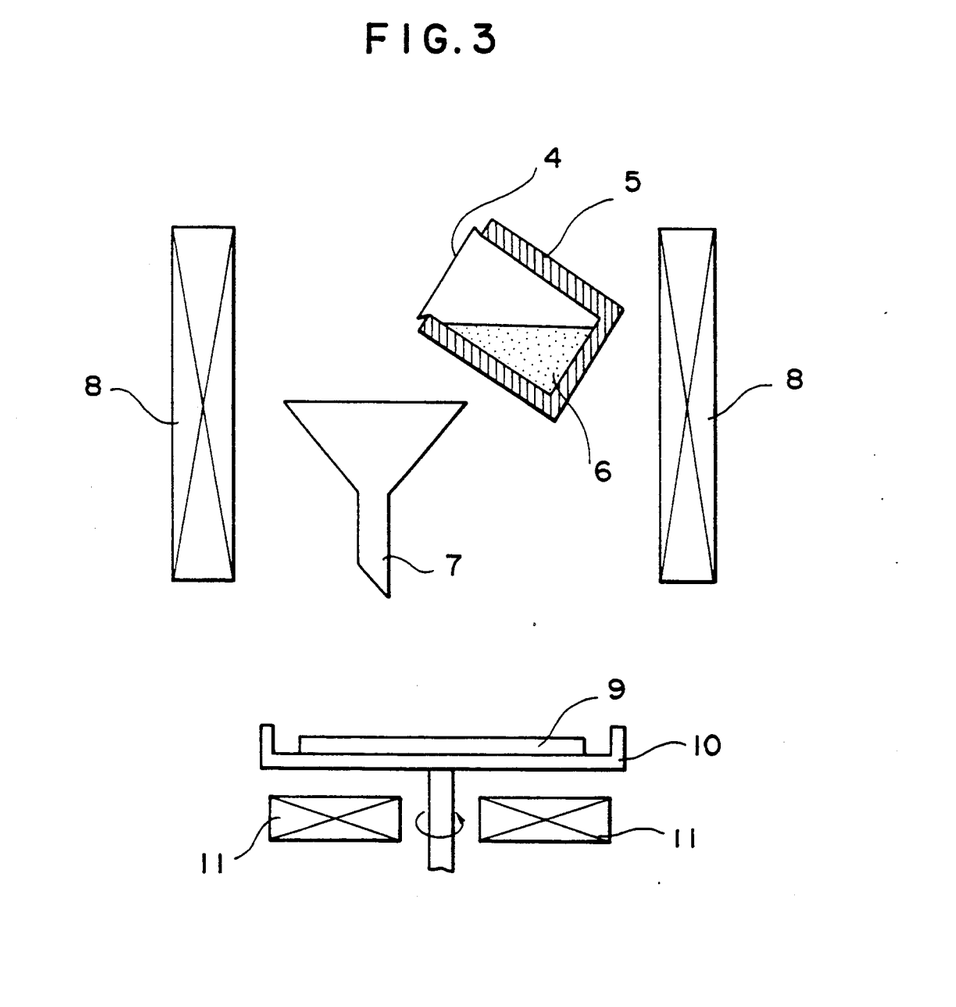
FIG. 3 is a preparation device of a hybrid substrate of the present invention according to molten silicon dropping method.

FIG. 3 illustrates a preparation device when molten silicon is added dropwise onto a polycrystalline alumina base substrate to form a polysilicon film, the surface of which is in turn flattened to form a hybrid substrate.

More specifically, the device shown in FIG. 3 consists of a portion which melts silicon at a high temperature and adds it dropwise and a rotating holder which heats the alumina base substrate.

In the following, the preparation steps of the hybrid substrate are to be described.

In FIG. 3, silicon 6 is melted by heating a quartz crucible 4 (covered on the surrounding with graphite 5) to 1450° C. by a carbon heater 8. The molten silicon is now under the state to be added dropwise through a quartz funnel 7, and will be added dropwise onto an alumina base substrate 9.

The alumina base substrate 9 is mounted on a rotatory holder 10 and rotated at 100 to 400 rpm, and heated to 1000° to 1400° C. by a carbon heater 11.

Consequently, the silicon 6 added dropwise on the alumina base substrate 9 will be spread through centrifugal force over the alumina base substrate 9 to be solidified as polycrystalline silicon layer with a thickness of 0.2 to 0.5 mm. This is mechanically polished similarly as in the first embodiment shown in FIGS. 1A to 1C.

Figure 4A:
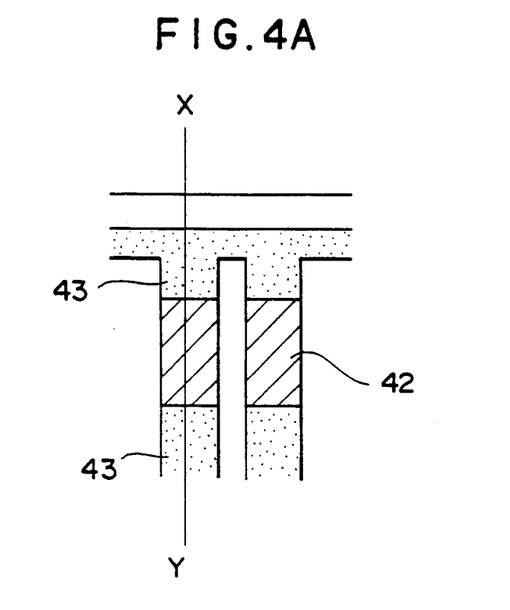
FIG. 4A is a plan view of the case when a thermal head is formed on the hybrid substrate of the present invention, and FIG. 4B its X-Y sectional view.
Figure 4B:
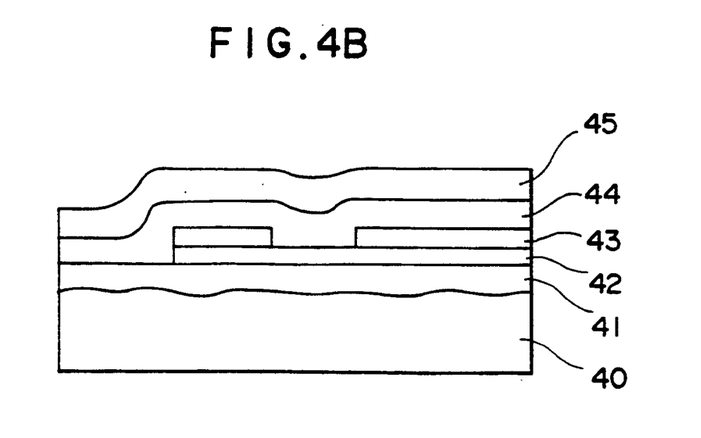

Next, the steps for forming a thermal head on the alumina ceramic base substrate/polycrystalline silicon film hybrid substrate prepared according to the method as described above are shown. FIGS. 4A and 4B show a constitution of a thermal head.

On the above hybrid substrate is deposited a TaN film 42 to 1000 Å in thickness by the sputtering method. Next, an Al film 43 is deposited to 5000 Å in thickness by the sputtering method. It is then subjected to conventional photolithographic technique to prepare a pattern with a heater size of 50 μm × 20 μm (FIG. 4A). Further, the oxidation preventive layer 44 is formed by depositing $SiO_2$ to 1 μm in thickness by the sputtering method. Further an abrasion resistant layer 45 is formed by depositing $Ta_2O_5$ to 3 μm in thickness by the sputtering method.

FIG. 4B shows the sectional constitution of the thus prepared thermal head.

The characteristics of the hybrid substrates obtained in the Embodiments 1 to 3 as described above are listed in Table 1 together with prior art examples.

As shown in Table 1, the hybrid substrates according to the present invention as described mainly by above respective embodiments are found to satisfy the desired levels in all aspects of flatness, workability, strength, thermal conductivity, uniformness and cost.

As described mainly by above embodiments 1 to 3, by use of the hybrid substrate of the present invention, there can be readily provided a head provided with a large number of heat-generating active device over large area because desired levels are satisfied in all aspects of flatness, workability, high thermal conductivity, uniformness and cost.

TABLE 1

|  |  | Flatness | Workability | Strength | Thermal Conductivity | Uniformity | Cost |
|---|---|---|---|---|---|---|---|
| Example | Si/$Al_2O_2$ Hybrid | ○ | ○ | ⊚ | ○ | ⊚ | ○ |
| Prior Art | Poly-Si | ○ | Δ | X | ⊚ | Δ | X |
| Example | Alumina | X | X | ⊚ | Δ | ○ | ⊚ |

TABLE 1-continued

|  | Flatness | Workability | Strength | Thermal Conductivity | Uniformity | Cost |
|---|---|---|---|---|---|---|
| Grazed Alumina | ○ | Δ | ⊚ | X | ○ | ⊚ |

(⊚ Very Good, ○ Good, Δ Slightly Bad, X Considerably Bad)

Embodiment 4

Figure 5:
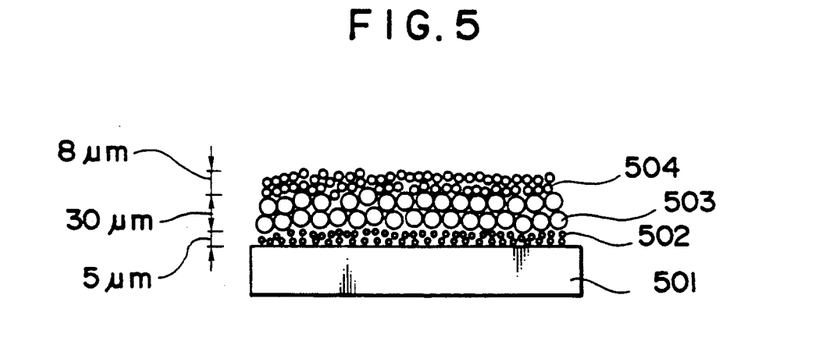
FIG. 5 shows a sectional structure of a ceramic/polycrystalline silicon hybrid substrate showing still another example of preferred embodiment of the present invention.

FIG. 5 is a sectional structure showing an example of the hybrid substrate of prefered embodiment of the present invention. The polycrystal of the lowest layer 502 formed on the surface of the ceramic base substrate 501 has a small grain size of 0.5 μm or less, and such small grains fill the voids, etc. on the surface of the ceramic base substrate 501, and further relax the strain between different kinds of materials due to difference in coefficient of linear expansion. The second layer 503 has a grain size of 2 μm or more to be reduced in grain boundaries, and maintains high thermal conductivity. The third layer 504 has a small grain size of 0.5 μm or less to improve flatness of the substrate surface.

Thus, the hybrid substrate shown in FIG. 5 has a flat surface and a good thermal conductivity because a polycrystalline layer of multilayer constitution of plural layers having different polycrystalline grain sizes laminated in the film thickness direction are provided on the surface.

Figure 6:
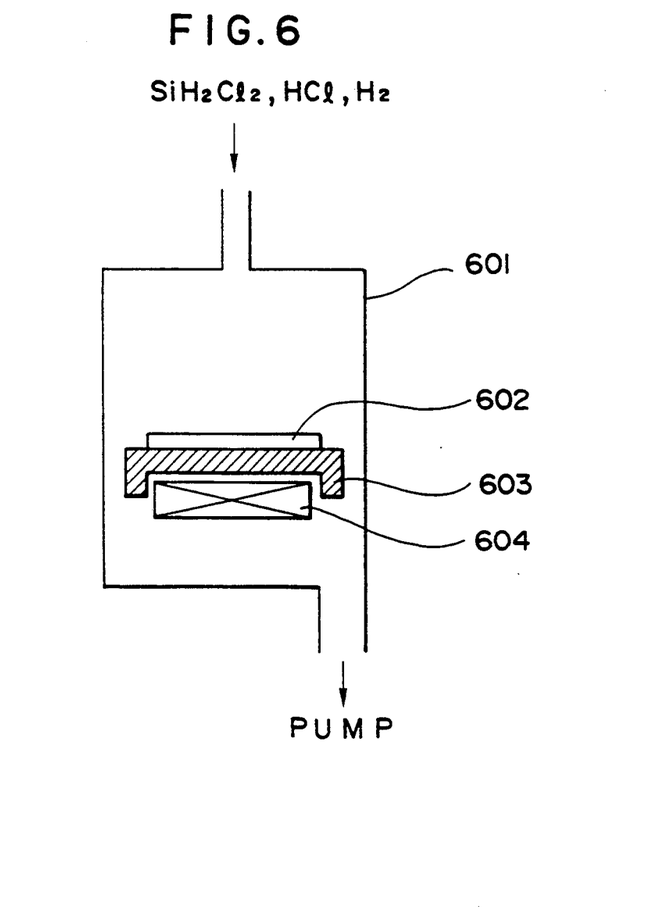
FIG. 6 is a schematic illustration showing an epitaxial crystal growth device for deposition of the polycrystalline silicon film controlled in grain size.

FIG. 6 is a schematic illustration of a silicon epitaxial growth device for preparation of the hybrid substrate of the present invention shown in FIG. 5.

In FIG. 6, the quartz bell jar 601 is evacuated internally by a vacuum pump, and a polycrystalline silicon film is deposited on an alumina base substrate 602 under the state of reduced pressure by introducing reactive gases such as $SiH_2Cl_2$, $HCl$, $H_2$, etc. The alumina base substrate 602 is held on a carbon susceptor 603 heated by a high frequency coil 604.

Next, the process of deposition of polycrystalline silicon film is to be described below.

First, the alumina base substrate 501 is heated to a high temperature (900° to 1100° C.) and the surface of the substrate is cleaned by flowing HCl, followed by the deposition of polycrystalline silicon layer on the alumina base substrate 501 under an atmosphere of a gas mixture of $SiH_2Cl_2$ and HCl diluted with $H_2$.

The grain size of each layer (layers 502, 503 and 504) can be controlled by the mixing ratio of the respective gases, the substrate temperature, pressure, etc.

Figure 7:
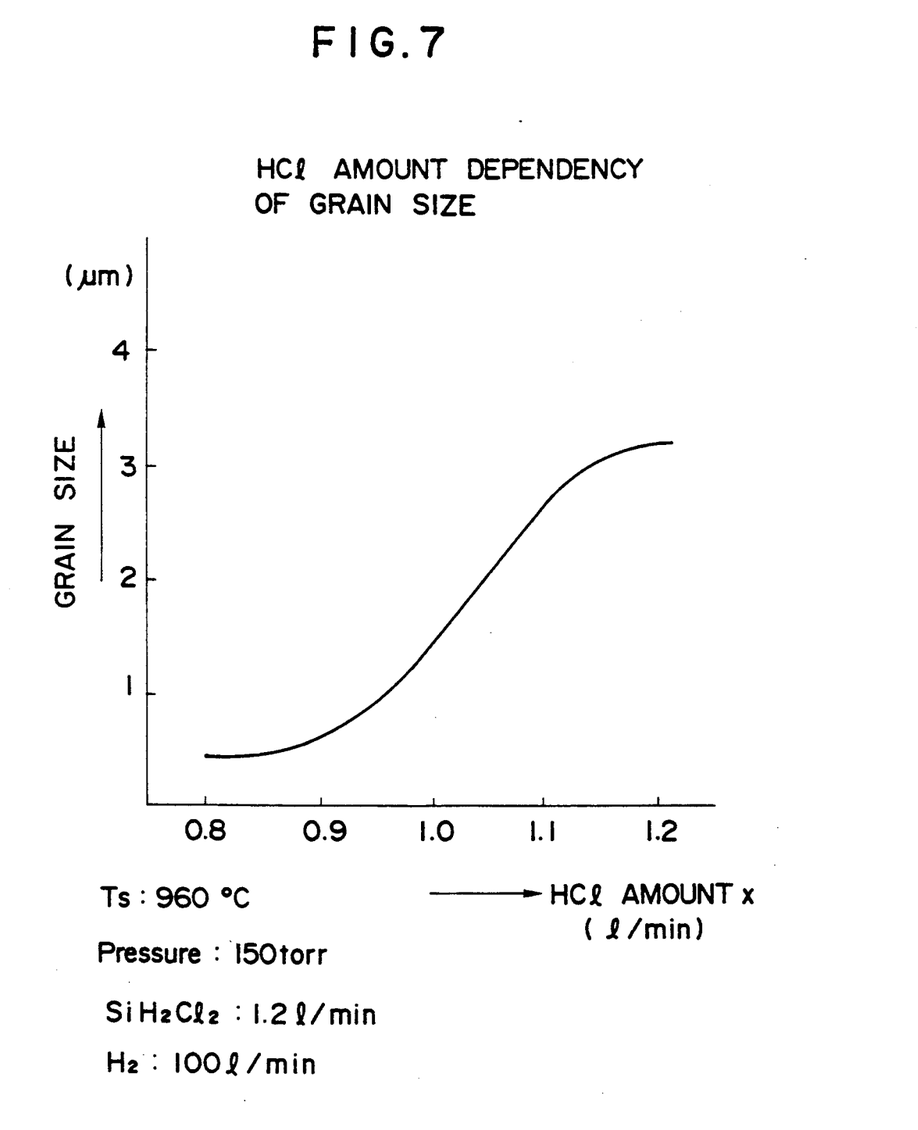
FIG. 7 is a graph showing the relationship between the polycrystalline silicon grain size and the HCl content in the starting gas.

FIG. 7 is the result of examination of the relationship between the flow rate of HCl and the grain size, from which there can be seen a tendency that the grain size becomes greater as the flow rate of HCl is increased.

Figure 8:
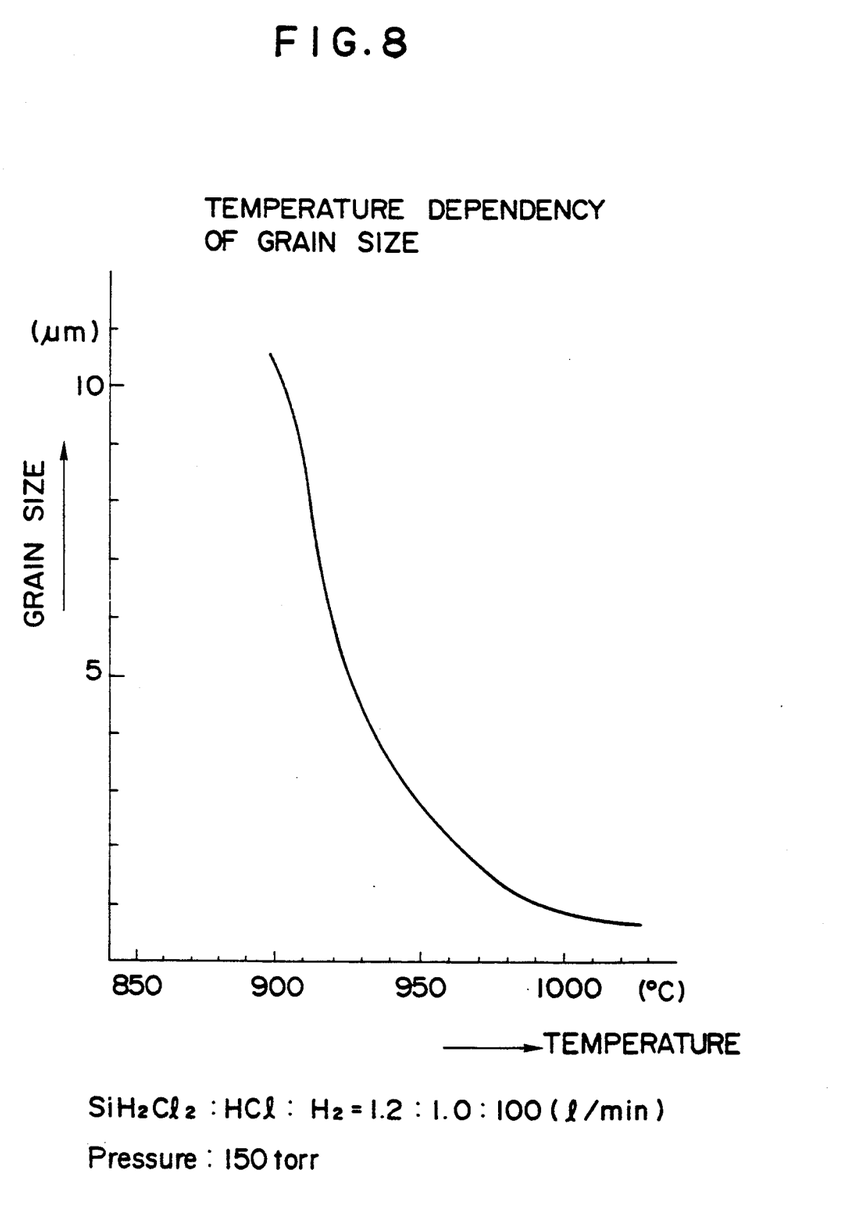
FIG. 8 a graph showing the relationship between the polycrystalline silicon grain size and the substrate temperature.

FIG. 8 is the result of examination of the relationship between the substrate temperature and the grain size, from which it can be seen that the grain size becomes smaller as the substrate temperature becomes higher.

Figure 9:
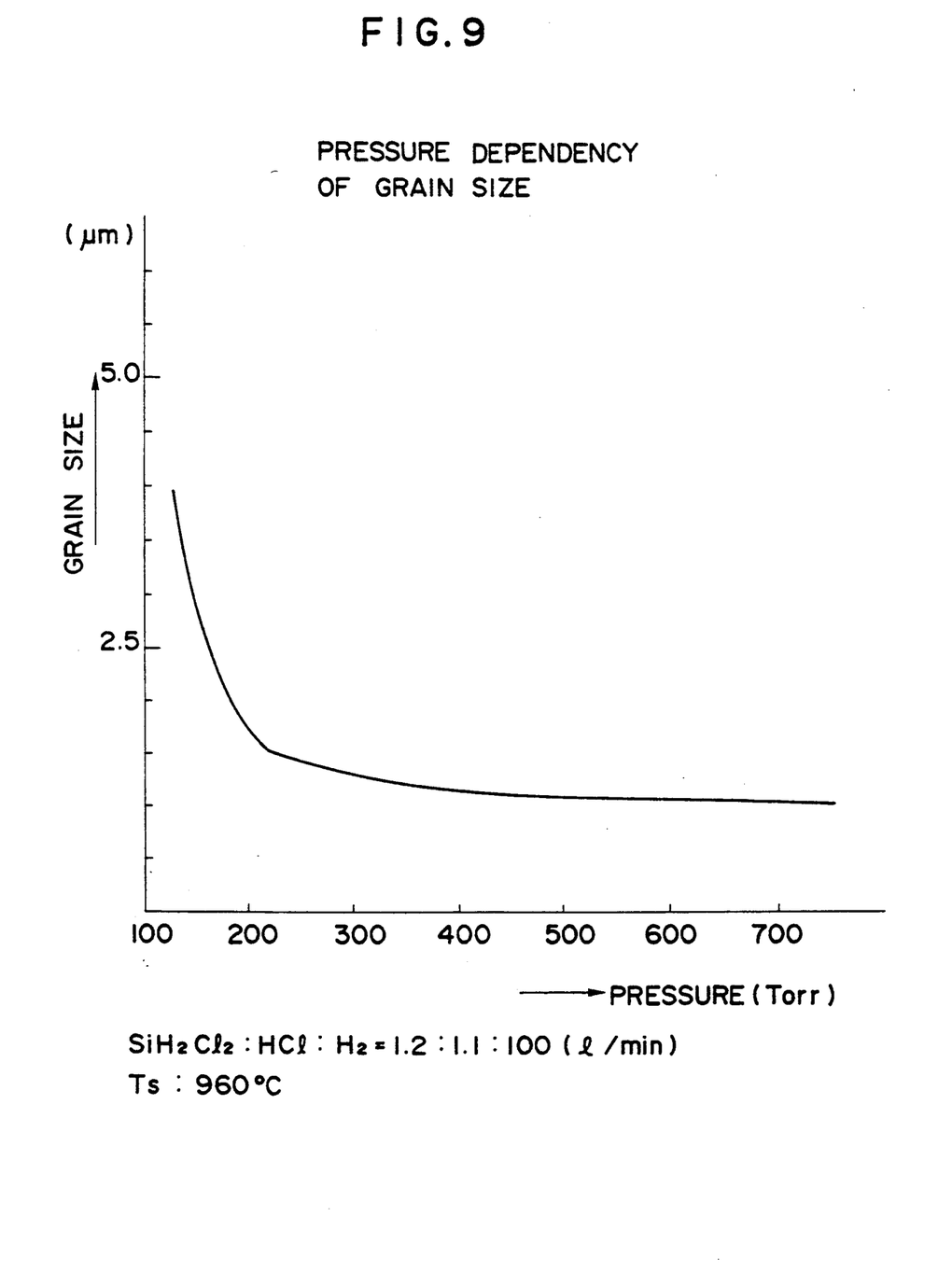
FIG. 9 a graph showing the relationship between the polycrystalline silicon grain size and the reaction pressure.

FIG. 9 is the result of examination of the relationship between the pressure and the grain size, which shows that the grain size becomes smaller as the pressure becomes higher.

By controlling these parameters, a polycrystalline silicon layer constituted by polycrystalline grain having a desired grain size can be laminated to give a desired hybrid substrate suitable to the object of the present invention.

As described above with regard to one example by referring to FIGS. 5 to 9, according to the hybrid substrate of the present invention, a polycrystalline film can be deposited with a flat surface on a ceramic substrate having poor surface flatness, and yet a large area hybrid substrate which is highly heat-resistant with good thermal conductivity can be obtained.

I claim:

1. A hybrid substrate comprising an aluminum-based ceramic base substrate and a silicon layer provided directly on said base substrate, wherein said silicon layer has a thickness of 20 μm or more.

2. A hybrid substrate comprising a polycrystalline ceramic base substrate and a silicon layer provided directly on said base substrate, wherein said silicon layer has a thickness of 20 μm or more.

3. A hybrid substrate comprising a ceramic base substrate and a polycrystalline layer of a different material from said ceramic base substrate deposited on said ceramic base substrate, said polycrystalline layer being constituted of plural layers of varying crystal grain sizes, wherein:
   (a) the lowest layer among the layers constituting said polycrystalline layer deposited on the ceramic base substrate has a thickness of 10 μm or less, and a crystal grain size of 1 μm or less,
   (b) the second layer laminated directly on the lowest layer amount the layers constituting said polycrystalline layer has a thickness of 10 to 50 μm or less, and a crystal grain size of 2 μm or more and
   (c) the uppermost layer among the layers constituting said polycrystalline layer has a grain size of 0.5 μm or less.

4. A hybrid substrate comprising a ceramic base substrate and a polycrystalline layer of a different material from said ceramic base substrate deposited on said ceramic base substrate, said polycrystalline layer being constituted of plural layers of varying crystal grain sizes, wherein:
   (a) the lowest layer among the layers constituting said polycrystalline layer deposited on the ceramic base substrate has a thickness of 10 μm or less, and a crystal grain size of 1 μm or less,
   (b) the second layer laminated directly on the lowest layer among the layers constituting said polycrystalline layer has a thickness of 10 to 50 μm or less, and a crystal grain size of 2 μm or more and
   (c) the uppermost layer among the layers has a grain size of 0.5 μm or less;
   said ceramic base substrate being an aluminum oxide polycrystalline sintered product.

5. A hybrid substrate comprising a ceramic base substrate and a polycrystalline layer of a different material from said ceramic base substrate deposited on said ceramic base substrate, said polycrystalline layer being constituted of plural layers of varying crystal grain sizes, wherein:
   (a) the lowest layer among the layers constituting said polycrystalline layer deposited on the ceramic base substrate has a thickness of 10 μm or less, and a crystal grain size of 1 μm or less,
(b) the second layer laminated directly on the lowest layer among the layers constituting said polycrystalline layer has a thickness of 10 to 50 μm or less, and a crystal grain size of 2 μm or more, and
(c) the uppermost layer among the layers constituting said polycrystalline layer has a grain size of 0.5 μm or less;

said polycrystalline layer being polycrystalline silicon.

* * * * *

UNITED STATES PATENT AND TRADEMARK OFFICE
CERTIFICATE OF CORRECTION

PATENT NO. : 5,134,018

DATED : July 28, 1992

INVENTOR(S) : HIROYUKI TOKUNAGA          Page 1 of 2

It is certified that error appears in the above-identified patent and that said Letters Patent is hereby corrected as shown below:

ON THE TITLE PAGE

AT [56] REFERENCES CITED

Foreign Patent Documents,
"5356042" should read --53-56042-- and
5929460" should read --59-29460--.

COLUMN 2

Line 42, "FIG. 8" should read --FIG. 8 is--.
Line 45, "FIG. 9" should read --FIG. 9 is--.

COLUMN 3

Line 19, "throughout" should read --throughput--.

COLUMN 4

Line 57, "device" should read --devices--.

COLUMN 5

Line 13, "prefered" should read --a preferred--.

UNITED STATES PATENT AND TRADEMARK OFFICE
CERTIFICATE OF CORRECTION

PATENT NO. : 5,134,018

DATED : July 28, 1992

INVENTOR(S) : HIROYUKI TOKUNAGA

It is certified that error appears in the above-identified patent and that said Letters Patent is hereby corrected as shown below:

COLUMN 6

Line 37, "amount" should read --among--.
Line 57, "layers has" should read --layers constituting said polycrystalline layer has--.

Signed and Sealed this

Twenty-first Day of September, 1993

Attest:

BRUCE LEHMAN

Attesting Officer                Commissioner of Patents and Trademarks